United States Patent [19]

Ahn et al.

[11] Patent Number: 5,445,993
[45] Date of Patent: Aug. 29, 1995

[54] SEMICONDUCTOR LASER DIODE AND METHOD FOR MANUFACTURING THE SAME

[75] Inventors: Hyung S. Ahn, Kyungki; Min S. No, Seoul; Sang K. Si, Kyungki; Won T. Choi, Seoul; Joo O. Seo, Seoul; Jin H. Lim, Seoul; Min Yang, Seoul, all of Rep. of Korea

[73] Assignee: Goldstar Co., Ltd., Seoul, Rep. of Korea

[21] Appl. No.: 67,834

[22] Filed: May 27, 1993

[30] Foreign Application Priority Data

May 27, 1992 [KR] Rep. of Korea ............... 9056/1992
Feb. 8, 1993 [KR] Rep. of Korea ............... 1691/1993

[51] Int. Cl.$^6$ ............................................. H01L 21/20
[52] U.S. Cl. ............................................. 431/129
[58] Field of Search ................... 437/129; 117/95

[56] References Cited

U.S. PATENT DOCUMENTS

| | | | |
|---|---|---|---|
| 4,329,189 | 5/1982 | Noad et al. | 437/129 |
| 4,567,060 | 1/1986 | Hayakawa et al. | 427/87 |
| 4,635,268 | 1/1987 | Motegi et al. | 372/45 |
| 4,783,425 | 11/1988 | Fukuzawa et al. | 437/129 |
| 4,950,622 | 8/1990 | Kwon et al. | 437/129 |

FOREIGN PATENT DOCUMENTS

0132081A2 7/1983 European Pat. Off.
0142845A3 5/1985 European Pat. Off.
63-49396 10/1988 Japan.

OTHER PUBLICATIONS

Takao Shibutani, et al., "A Novel High-Power Laser Structure with Current-Blocked Regions Near Cavity Facets," IEEE Journal of Quantum Electronics, vol. QE-23, No. 6 (Jun. 1987).

*Primary Examiner*—R. Bruce Breneman
*Assistant Examiner*—Linda Fleck
*Attorney, Agent, or Firm*—Finnegan, Henderson, Farabow, Garrett & Dunner

[57] ABSTRACT

A semiconductor laser diode includes a semiconductor substrate, an active layer having a double hetero structure formed on the semiconductor substrate, a first quantum well layer formed between the active layer and the current confinement layer, a second quantum well layer formed on the active layer corresponding to the current injection groove, and a clad layer having its flat surface formed on the current injection groove and the current confinement layer. A method for manufacturing the semiconductor laser diode includes the steps of forming an active layer having a double hetero structure on the semiconductor substrate, selectively forming a current confinement layer on the active layer to form a current injection groove, forming a clad layer having its flat surface on the current injection groove and the current confinement layer.

20 Claims, 10 Drawing Sheets

SEMICONDUCTOR LASER DIODE AND METHOD FOR MANUFACTURING THE SAME

BACKGROUND OF THE INEVNTOIN

1. Field of the Invention

The present invention relates to a semiconductor laser diode and a method for manufacturing the same. More particularly, the invention relates to a semiconductor laser diode and a method for manufacturing the same in which an internal current injection groove is formed by a selective growth.

2. Description of the Related Art

Generally, a laser diode has a refractive index waveguide type structure to obtain a stable, single mode, low threshold voltage for driving and high quantum efficiency. Such laser diodes of the refractive index waveguide type usually have an internal current confinement layer positioned at the upper side of an active layer or the lower side of the active layer in accordance with the conductive type of a substrate, so as to effectively confine the current.

A method for making a conventional laser diode having the aforementioned current confinement layer involves first growing the current confinement layer and then selectively etching the same to form a current injection groove. FIG. 1 shows a sectional view of a conventional semiconductor laser diode in which a current injection groove is formed by a selective etching.

The manufacturing process of the conventional semiconductor laser diode will now be described in conjunction with FIG. 1.

First, over a substrate 1, a first clad layer 2, an active layer 3, a second clad layer 4, a first semiconductor layer 5, a current confinement layer 6 and a second semiconductor layer 7 are formed in that order. The second semiconductor layer 7 is then selectively removed with an etching solution. A predetermined portion of the current confinement layer 6 is then slope-etched to form a current injection groove.

Subsequently, a third clad layer 8 and a cap layer 9 are formed in that order and then electrodes 10, 11 are formed over the upper surface of cap layer 9 and the bottom surface of substrate 1, respectively.

In such a semiconductor laser diode, the clad layer 4 is directly exposed without the first semiconductor 5 since it is impossible to merely etch the current confinement layer 6 selectively. In this connection, a semiconductor laser diode has been proposed in which growth layers are formed by a metal organic chemical vapour deposition and then a current injection groove is formed by a selective etching, as above mentioned, by Japanese patent publication No. 63-49396 and European patent No. 0,132,081.

The proposed method selectively etches a GaAs, serving as the current confinement layer 6, and AlGaAs, serving as the second clad layer 4, with $NH_4OH:H_2O$ as the etching solution, to form the current injection groove. However, a portion of AlGaAs serving as the second clad layer 4 corresponding to the current injection groove is exposed and the exposed AlGaAs is oxidized, thereby significantly affecting the characteristic of the semiconductor laser diode.

European Patent No. 0,142,845 has used $Al_{0.7}Ga_{0.3}As$ for the material of the current confinement layer 6, so that AlGaAs serving as the second clad layer 4 is not oxidized. In the method of this patent, with reference again to FIG. 1, first, over an n-type GaAs substrate 1, an n-type $Al_{0.45}Ga_{0.55}As$ clad layer 2, an undoped $Al_{0.45}Ga_{0.55}As$ active layer 3, a p-type $Al_{0.45}GaAs$ 4 having a thickness of 0.1 μm, a p-type GaAs oxidation prevention film 5 having a thickness of 0.005 μm, an n-type $Al_{0.7}Ga_{0.3}As$ current confinement layer 6 having a thickness of 0.8 μm, and an n-type GaAs oxidation prevention film 7 having a thickness of 0.005 μm are grown in this order, using a molecular beam epitaxy (MBE) method.

Subsequently, a photoresist is subjected to a photolithography process to form a stripe groove pattern having a width of 20 μm (not shown) and then the n-type GaAs oxidation prevention film 7 is etched with $H_2O_2:NH_4OH$—5:1 serving as an etching solution using the stripe groove pattern as a mask.

Subsequently, if the n-type $Al_{0.7}Ga_{0.3}As$ current confinement layer 6 is etched by an HF solution, the surface of the p-type GaAs oxidation prevention film is exposed and the etching is stopped. Thereafter, a p-type $Al_{0.45}Ga_{0.55}As$ 8 and a p-type GaAs 9 are grown in that order by an MBE method and then electrodes 10,11 are formed.

If a current, that is, carriers are injected to the semiconductor laser diode shown in FIG. 1 through the electrodes 10, 11, the internal current confinement layer 6 confines the current effectively. Accordingly, it is possible to obtain the semiconductor laser diode having a low threshold current.

According to the conventional method for forming the current injection groove, however, it is very difficult to maintain its uniformity on a wafer having a large area for mass production. That is, since the current confinement layer is etched to form the current injection groove, it is impossible to uniformly form growth layers with the MBE method or metal organic chemical vapour deposition method on a wafer having a large area.

Also, according to Japanes Patent Publication No. 63-49396 and European Patent No. 0,132,081, the AlGaAs layer is exposed and oxidized after the etching for forming the current injection groove. Accordingly, the quality of a layer to be formed on the AlGaAs may be reduced, thereby deteriorating the reliability of the semiconductor laser diode.

As apparent from the above description, European patent 0,142,845 makes it possible to solve the above problems. However, the technique has disadvantages in that the etching process should be executed twice to form the current injection groove, it is difficult to control the etching in a lateral direction, and the side portion of the current injection groove is oxidized after the etching. Also, since $Al_{0.7}Ga_{0.3}As$ is used as the material of the current confinement layer, the technique has another disadvantage where n-type oxidation prevention film should be essentially grown on the $Al_{0.7}Ga_{0.3}As$ layer.

SUMMARY OF THE INVENTION

Therefore, an object of the invention is to eliminate the above-mentioned disadvantages encountered in the prior art and to provide a method for manufacturing a semiconductor laser diode in which a current injection groove is formed by a selective growth method.

Another object of the invention is to provide a semiconductor laser diode in which a current injection groove is formed by a selective growth method.

In one aspect, the present invention provides a method for manufacturing a semiconductor laser diode comprising the steps of forming an active layer having a double hetero junction structure on a semiconductor substrate; forming a current confinement layer selectively on the active layer to form a current injection groove on the active layer; and forming a clad layer having a flat surface on the current injection groove and the current confinement layer.

In another aspect, the present invention provides a semiconductor laser diode comprising a semiconductor substrate; an active layer having a double hetero junction structure formed on the semiconductor substrate; a current confinement layer and a current injection groove formed on the active layer; a first quantum well layer formed between the active layer and the current confinement layer; a second quantum well layer formed at the current injection groove region of an upper portion of the active layer; and a clad layer having a flat surface formed on the current injection groove and the current confinement layer.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Hereinafter, embodiments of the present invention will be described in detail in conjunction with the attached drawings.

Figure 1:
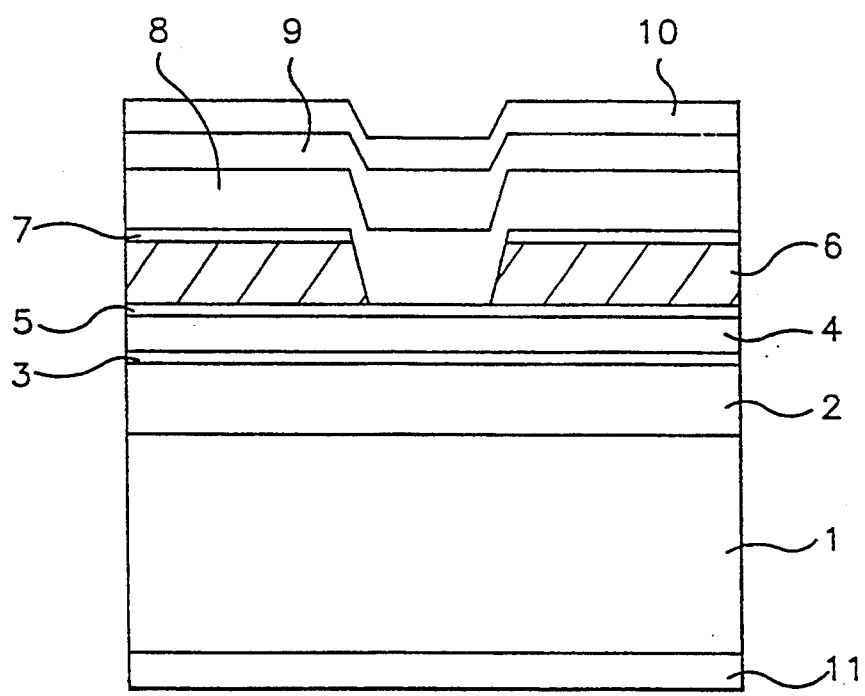
FIG. 1 is a sectional view showing the structure of a conventional semiconductor laser diode.
Figure 2:
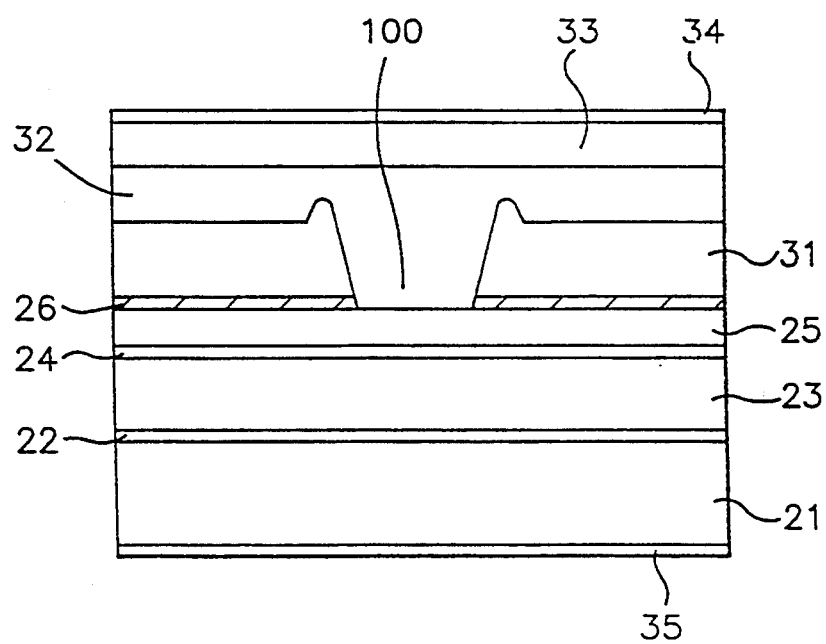
FIG. 2 is a sectional view showing the structure of a semiconductor laser diode in accordance with a first embodiment of the present invention.

In accordance with a first embodiment of the present invention as shown in FIG. 2, a semiconductor laser diode includes an n-type substrate 21 made of GaAs, an n-type buffer layer 22 made of GaAs, a first clad layer 23 made of n-type $Al_{0.45}Ga_{0.55}As$, an active layer 24 made of an undoped AlGaAs formed on the first clad layer 23, a second clad layer 25 which is made of p-type $Al_{0.45}Ga_{0.55}As$ with a thickness of 0.2-0.6 $\mu$m and is formed on the active layer 24, a quantum well layer 26 which is made of an undoped GaAs or low concentration p-type GaAs or low concentration n-type GaAs, with a thickness of 30-110 Å except at a current injection groove (100) at the surface of the second clad layer 25, a current confinement layer 31 formed on the quantum well layer 26, a third clad layer 32 made of p-type $Al_{0.45}Ga_{0.55}As$ formed on the current injection groove 100 and the current confinement layer 31, a cap layer 33 formed on the third clad layer 32, a p type electrode 34 formed on the upper surface of the cap layer 33, and an n-type electrode 35 formed on the lower surface of the substrate 21.

Another quantum well layer may be also formed in the current injection groove with a thickness which is smaller than one-half of the thickness of the quantum well layer 26.

In FIGS. 3a to 3l, a method for manufacturing a semiconductor laser diode is illustrated in accordance with the first embodiment of the present invention. In accordance with the method, first, over a GaAs substrate 21 an n-type GaAs buffer layer 22 with a thickness of greater than 0.5 $\mu$m is formed using an MOCVD method.

A first clad layer 23 made of n-type $Al_{0.45}Ga_{0.55}As$ and an active layer 24 made of an undoped AlGaAs are formed on the n-type GaAs buffer layer 22, in that order.

Subsequently, a second clad layer 25 made of p-type $Al_{0.45}Ga_{0.55}As$ is formed with a thickness of 0.2-0.65 $\mu$m on the active layer 24 and then a quantum well layer 26 made of an undoped GaAs or a p-type GaAs having a low concentration or an n-type GaAs is formed on the second clad layer 25 with a thickness of 30-100 Å.

Over the quantum well layer 26 is formed an impurity permeation prevention film 27 made of p-type $Al_x Ga_{1-x}As$ ($x \geq 0.6$).

The impurity permeation prevention film 27 prevents the permeation of silicon and the reason why the impurity permeation prevention film 27 should be formed is as follows.

To selectively grow a current confinement layer at a region except for a current injection groove at the surface of the quantum well layer 26, an insulation film, such as $SiO_2$ or $Si_3N_4$ and having a completely different characteristic from GaAs, is used as a mask upon the selective growth of the current confinement layer. At this time, a mono-crystal having a characteristic such as GaAs substrate is not grown at regions in which the insulation film is formed but a poly-crystal exists at such regions.

If the insulation film, such as $SiO_2$ or $Si_3N_4$, is directly deposited on the quantum well layer 26 without the impurity permeation prevention film 27, and remains for a long time at a high temperature for growing the current confinement layer, silicon impurities are permeated from the insulation film, such as $SiO_2$ or $Si_3N_4$, to the quantum well layer 26. This causes the quantum well layer 26 to break down due to the permeation of silicon impurities and a grainy texture phenomenon occurs in which the surface of the quantum well layer 26 becomes rough. Accordingly, the impurity permeation prevention film 27 is formed on the quantum well layer 26 having a thickness of greater than 0.1 $\mu$m so as to protect the quantum well layer 26 from the permeation of silicon impurities.

Figure 3A:
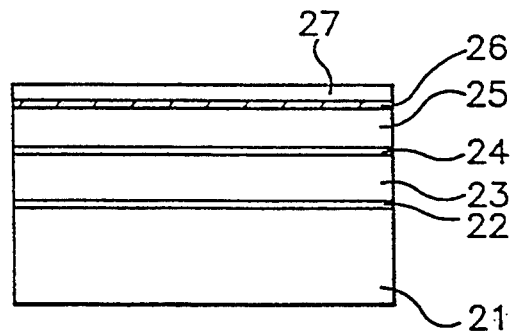
FIGS. 3a to 3l are sectional views showing a method for manufacturing a semiconductor laser diode in accordance with a first embodiment of the present invention.
Figure 3B:
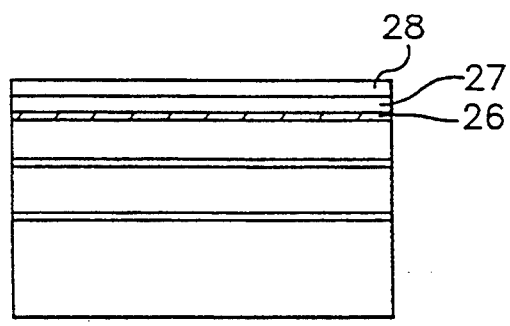
Figure 3C:
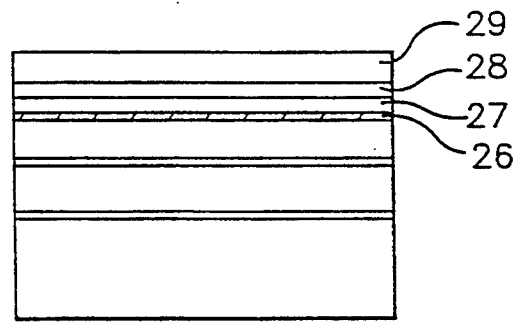
Figure 3D:
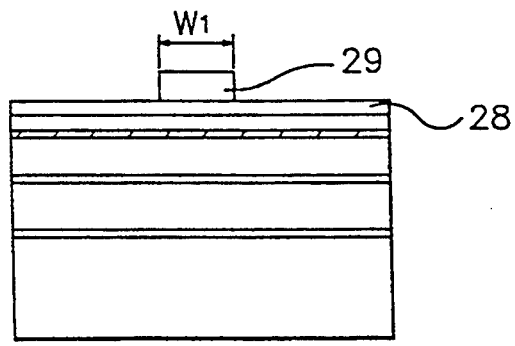

Subsequently, an insulation film 28 such as $SiO_2$ or $Si_3N_4$ is deposited on the impurity permeation prevention film 27, as shown in FIG. 3b. Thereafter, a first photo-resist 29 is coated on the insulation film 28 as shown in FIG. 3c. Then, the photo-resist 29 is subjected to a patterning process to provide a constant width (for example, about 5 μm), thereby defining the region of the current injection groove.

Figure 3E:
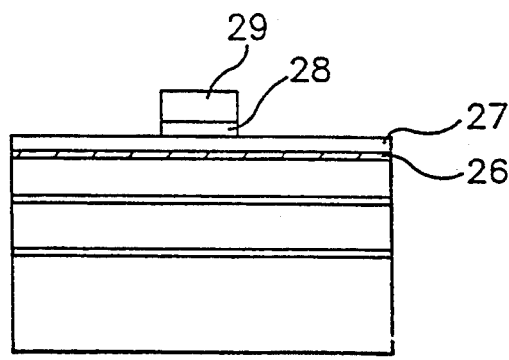
Figure 3F:
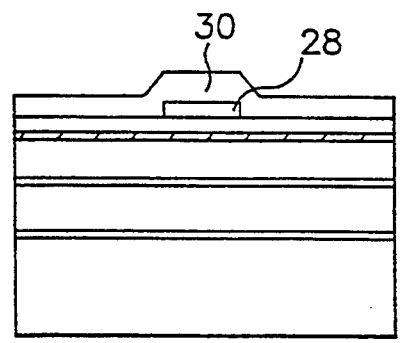
Figure 3G:
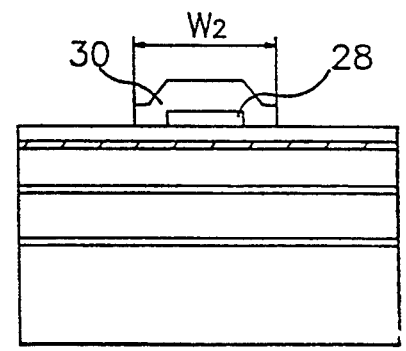

As shown in FIG. 3e, the insulation film is selectively etched using the patterned first photo-resist as a mask and then the patterned first photo-resist is removed. Subsequently, a second photo-resist 30 of the same kind as the first photo-resist 29 is coated over the whole surface including the surface of the insulation film 28 as shown in FIG. 3f and then the second photo-resist 30 is patterned through a photolithography process such that a constant width $W_2$ (for example, about 10 μm) results, as shown in FIG. 3g.

Figure 3H:
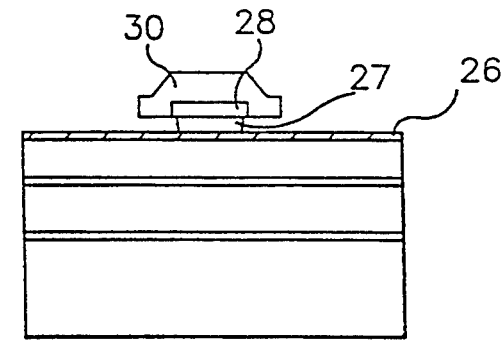

Next, the impurity permeation prevention film 27 is wet-etched with an HF solution using the patterned second photo-resist 30 as a mask, as shown in FIG. 3h. At this time, the wet-etching is stopped at the quantum well layer 26 since the quantum well layer 26 positioned below the impurity permeation prevention film 27 is made of GaAs. The impurity permeation prevent film 27 is etched such that a width of 4 μm result similar to width $W_1$ (5 μm) of the patterned first photo-resist 29.

Figure 3I:
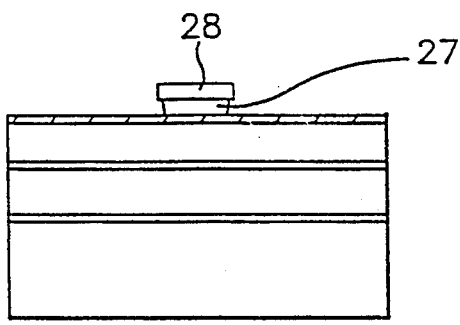
Figure 3J:
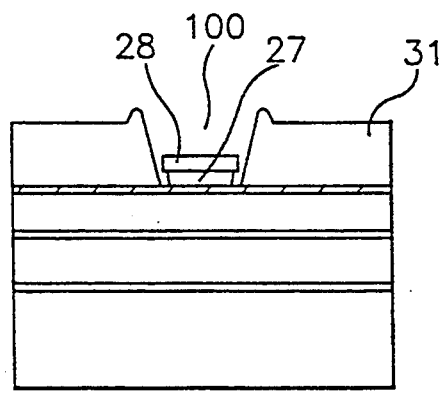

Subsequently, the patterned photo-resist 30 is removed as shown in FIG. 3i and then a current confinement layer 31 is grown over the whole surface of the quantum well layer 26 shown in FIG. 3i using a metal organic chemical vapour deposition (MOCVD) method as shown in FIG. 3j, thus forming a current injection groove 100.

The process shown in FIG. 3j utilizes a principle in which a crystal material having a certain characteristic can be grown on a crystal material having the same characteristic (that is, if the wafer shown in FIG. 3i is subjected to a crystal growth process). GaAs crystal is not grown on the insulation film 28 and the impurity permeation prevention film 27 which remains on the GaAs quantum well layer 26, is merely grown on a portion in which the quantum well layer 26 is exposed, that is, a region except for the current injection groove. Accordingly, the current confinement layer and the current injection groove can be formed simultaneously without another process.

The shape of the current injection groove may be varied along the crystal direction of the quantum well layer 26 as shown in FIG. 3i. Upon the patterning of the second photo-resist 30, the stripe direction of the current injection groove is decided in accordance with whether the crystal direction of a layer (quantum well layer 26) positioned just below the second photo-resist 30 is $<0\bar{1}1>$ or $<011>$ and $<0\bar{1}1>$ or $<01\bar{1}>$.

If the crystal direction of the quantum well layer 26 is $<011>$ or $<0\bar{1}\bar{1}>$, the current injection groove is formed with a V shape. On the other hand, if the crystal direction of the quantum well layer 26 is $<0\bar{1}1>$ or $<01\bar{1}>$, the current injection groove is formed with a reverse mesa shape.

Figure 3K:
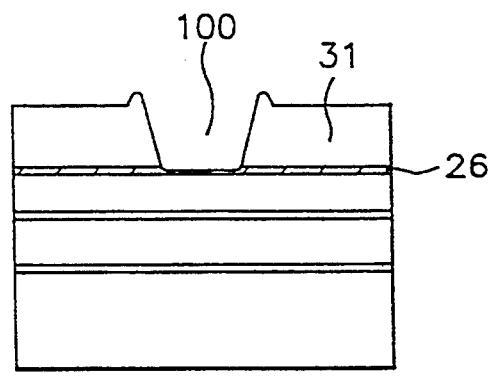

Thereafter, the wafer shown in FIG. 3j is dipped into an HF solution, which is a selective etching solution, to remove the impurity permeation prevention film 27 and the insulation film 28, as shown in FIG. 3k. At this time, the quantum well layer 26 in the current injection groove is also etched until the thickness is reduced to less than one-half of the original thickness and the current confinement layer 31 may be also removed by the HF solution together with a natural oxide which is formed thereon as they are exposed to air.

Therefore, the wafer shown in FIG. 3k is immediately cleaned with deionized water after the above-etching using the HF solution.

Figure 3L:
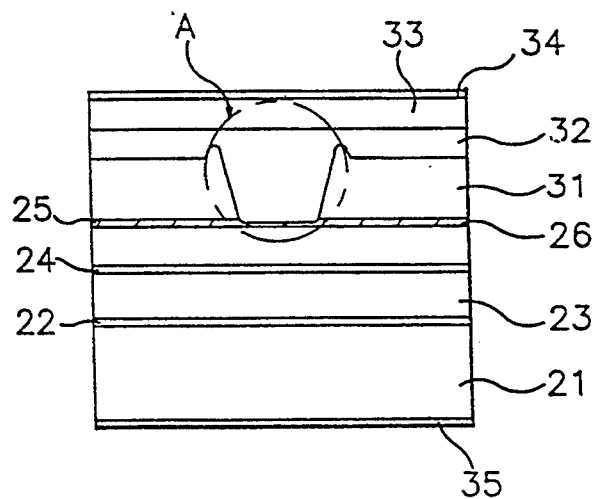

Subsequently, a third clad layer 32 made of p-type $A_{0.45}Ga_{0.55}As$ and p-type cap layer 33 made of GaAs are formed on the current confinement layer 31, in this order, using a liquid phase epitaxy method, as shown in FIG. 3l. At this time, since the third clad layer 32 made of $A_{0.45}Ga_{0.55}As$ is grown on the quantum well layer 26, a phenomenon occurs in which the quantum well layer 26 made of GaAs is melted back into the third clad layer 32 made of $A_{0.45}Ga_{0.55}As$, thereby enabling the defects in region A of FIG. 3l to be completely removed.

The third clad layer 32 and cap layer 33 may be grown using an MOCVD method.

In the described first embodiment, the impurity permeation prevention film 27 made of an undoped GaAs may be directly formed on the second clad layer 25 in the current injection groove without forming the quantum well layer 26. Also, the impurity permeation prevention film 27 should be formed with a thickness of greater than 0.1 μm to prevent the grainy texture phenomenon in which the surface becomes rough due to an insulation film such as $SiO_2$ or $Si_3N_4$, as mentioned above.

Although the quantum well layer is not used in the above case, it is possible to grow the third clad layer 32 and the cap layer 33 with an MOCVD method or an LPE method.

Also, in the method for manufacturing a semiconductor laser diode in accordance with the first embodiment of the present invention, a double film of phosphorous silicate glass(PSG)/$SiO_2$ or PSG/$Si_3N_4$ serving as a mask upon the selective growth may be deposited on the quantum well layer 26 in place of the above impurity permeation prevention film 27. This prevents the grainy texture phenomenon in which the surface of the quantum well layer 26 becomes rough when the insulation film 28 such as $SiO_2$ or $Si_3N_4$ is used as a mask upon the selective growth.

Also, in place of $SiO_2$, $Si_3N_4$, PSG/$SiO_2$ and PSG/$Si_3N_4$, GaAs-$SiO_2$ film may be used as a mask. That is, the quantum well layer 26 is subjected to a heat treatment process under the condition of $O_2$ atmosphere, thereby to obtain the GaAs-$SiO_2$ film serving as a mask upon the selective growth.

Figure 4:
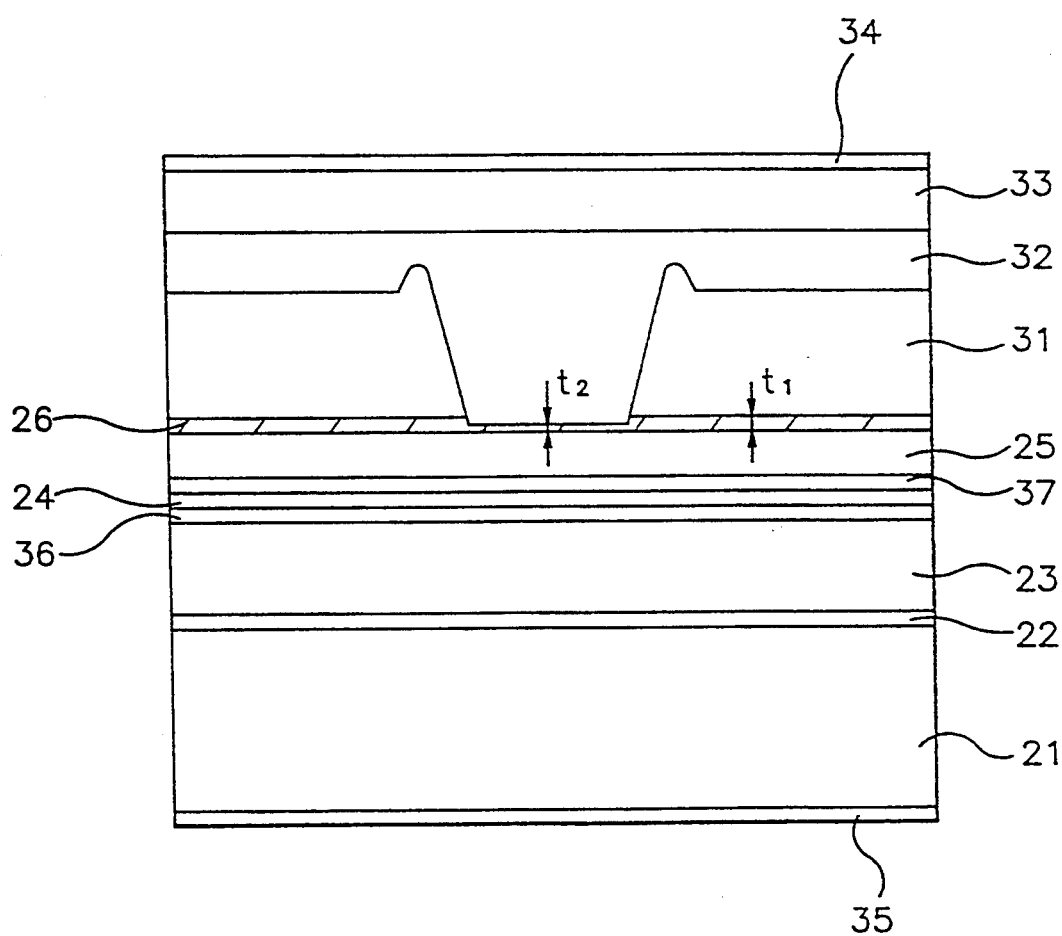
FIG. 4 is a sectional view showing the structure of a semiconductor laser diode in accordance with the second embodiment of the present invention.

FIG. 4 is a sectional view showing the structure of a semiconductor laser diode according to a second embodiment of the present invention.

According to the second embodiment, an AlGaAs layer, in which the content of Al is gradually decreased or increased in accordance with its height, is disposed between an active layer made of undoped GaAs and clad layers made of AlGaAs to obtain a funnel effect which increases the confinement of electrons in the active layer and the guide effect of electron-magnetic wave which is more effective. It is possible to lower the threshold current of semiconductor laser diode.

The semiconductor laser diode shown in FIG. 4 is called a graded index separate confinement hetero structure laser diode (GRIN-SCH laser diode).

The semiconductor laser diode according to the second embodiment of the present invention includes a substrate 21 made of GaAs, a buffer layer 22 made of an n-type GaAs and formed on the substrate 21, a first clad layer 23 made of an n-type $Al_{0.6}Ga_{0.4}As$ and formed on the buffer layer 22, a first graded layer 36 made of n-type $Al_{0.6 \to 0.2}Ga_{0.4 \to 0.8}As$ and formed on the first clad layer 23, an active layer 24 made of an undoped GaAs and formed on the first graded layer 36, a second graded layer 37 made of a p-type Al$_{0.6\rightarrow0.2}$Ga$_{0.4\rightarrow0.8}$As and formed on the active layer 24, and a second clad layer 25 made of a p-type Al$_{0.6\rightarrow0.2}$Ga$_{0.4\rightarrow0.8}$As and formed on the second graded layer 37. Over the second clad layer 25, a quantum well layer 26 is formed which is made of an undoped GaAs or a p-type GaAs having a low concentration or an n-type GaAs having a low concentration.

The quantum well layer 26 has different thicknesses at the current injection groove region and at the remaining region (namely, the current confinement region), i.e., the region excluding the current injection groove region. That is, the quantum well layer 26 is formed having a thickness $t_1$ on the current confinement region and having a thickness $t_2$, which is less than one-half of the thickness $t_1$, in the current injection region ($0 < t_2 < \frac{1}{2} t_1$).

A current confinement layer 31 is formed over the quantum well layer 26 corresponding to the current confinement layer. Over the current confinement layer 31 and the quantum well layer 26 corresponding to the current injection groove, a third clad layer is formed which is made of a p-type Al$_{0.6}$Ga$_{0.4}$AS.

Over the third clad layer 32, a cap layer 33 is formed which is made of a p-type GaAs. Over the upper surface of the cap layer 33 and the lower surface of the substrate 21, a p-type electrode 34 and an n-type electrode 35 are formed, respectively.

The method for manufacturing a semiconductor laser diode in accordance with the second embodiment will be described in detail with reference to FIG. 5a through FIG. 5l.

Figure 5A:
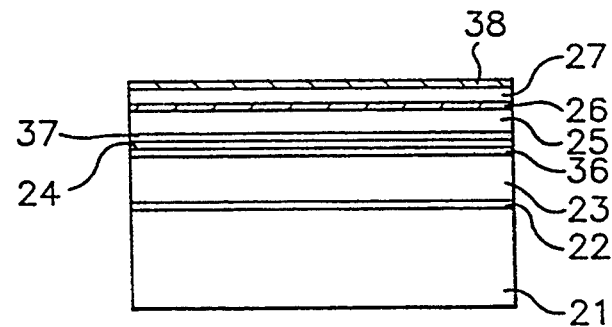
FIGS. 5a to 5l are sectional views showing a method for manufacturing a semiconductor laser diode in accordance with the second embodiment of the present invention.

First, as shown in FIG. 5a, over the substrate 21 made of an n-type GaAs, a buffer layer 22 is formed using the MOCVD method which is made of an n-type GaAs having a thickness of more than 0.5 μm.

Subsequently, a first clad layer 23 made of an n-type Al$_{0.6}$Ga$_{0.4}$AS and a first graded layer 36 made of an n-type Al$_{0.6\rightarrow0.2}$Ga$_{0.4\rightarrow0.8}$As are formed over the buffer layer 22, in this order.

Over the first graded layer 36, an active layer 24 made of an undoped GaAs and having a thickness of 50–100 Å, a second graded layer 37 made of a p-type Al$_{0.2\rightarrow0.6}$Ga$_{0.8\rightarrow0.4}$As and a second clad layer 25 made of a p-type Al$_{0.6}$Ga$_{0.4}$AS, are formed in this order.

Next, a quantum well layer 26 made of an undoped GaAs or a p-type GaAs having a low concentration or an n-type GaAs having a low concentrations is formed with a thickness of 30–100 Å on the second clad layer 25.

To prevent the quantum well layer 26 from the permeation of silicon ions, an impurity permeation prevention film 27, which is made of a p-type Al$_x$Ga$_{1-x}$AS ($x \geq 0.5$) is formed over the quantum well layer 26.

A selective removal film 38 is then formed over the impurity permeation prevention film 27. At this time, the selective removal film 38 is formed with a thickness of more than 1000 Å.

Figure 5B:
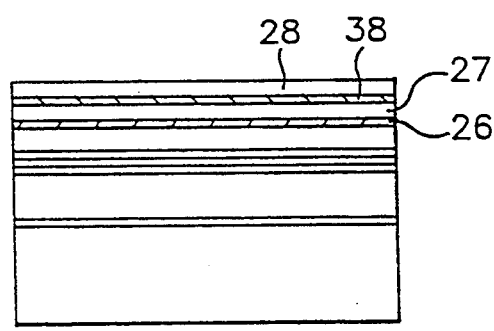
Figure 5C:
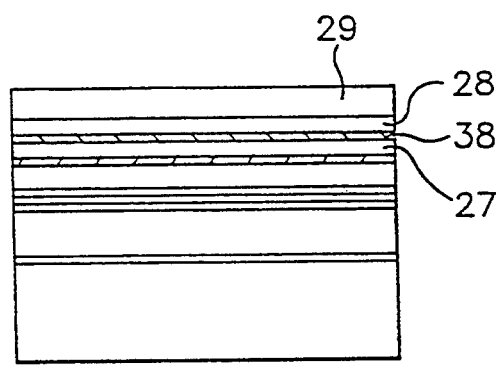

Thereafter, as shown in FIG. 5b, over the selective removal film 38, an insulation film 28 such as Si$_3$N$_4$ or SiO$_2$ is formed with a plasma enhanced chemical vapour deposition method (PECVD method) which has a thickness of about 500–3000 Å.

Figure 5D:
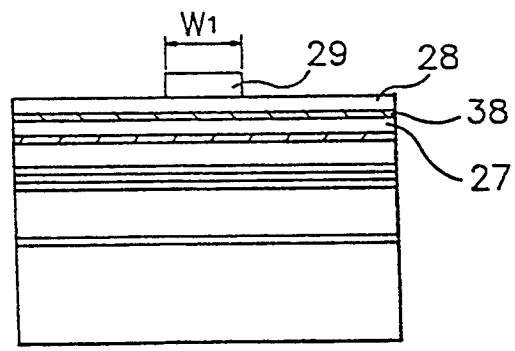
Figure 5E:
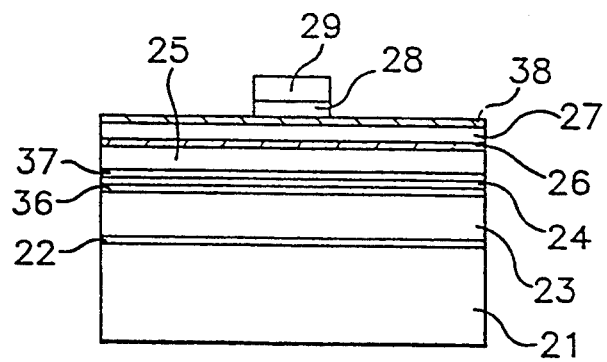

A first photo-resist 29 is patterned with a photolithography process such that the patterned first photo-resist has a constant width $W_1$ (for example, $W_1 = 3$–7 μm), as shown in FIG. 5d. Subsequently, the insulation film 28 is etched using the patterned first photo-resist 29 as an etching mask, as shown in FIG. 5e.

Figure 5F:
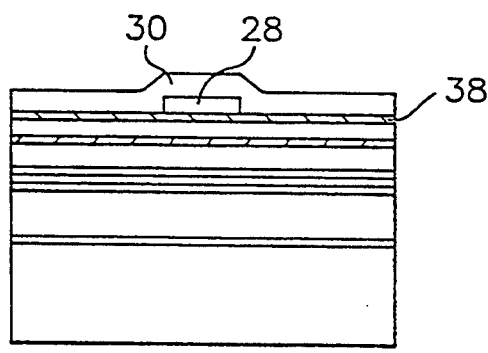

As shown in FIG. 5f, the patterned first photo-resist 29 is removed, and then, over the whole surface, including the surface of the insulation film 28, a second photo-resist 30 (the same kind as the above first photo-resist 29) is coated.

Figure 5G:
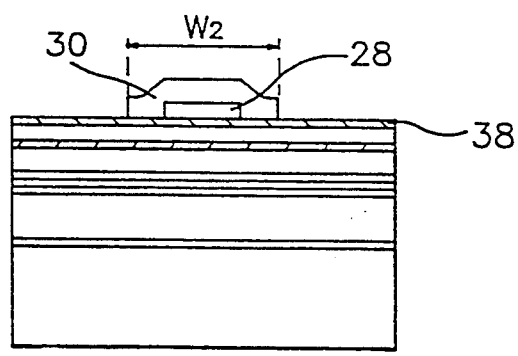
Figure 5H:
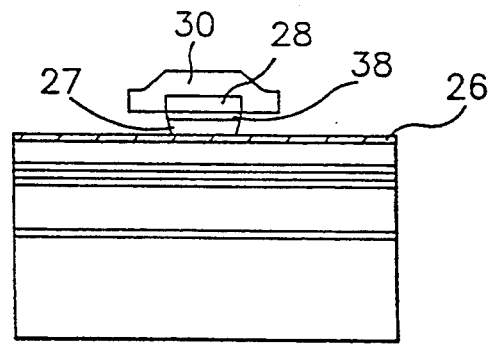

Subsequently, as shown in FIG. 5g, the second photo-resist 30 is patterned with a photolithography process such that the patterned second photo-resist 30 has a constant width $W_2$ (for example, $W_2 = 8$–12 μm) and then the selective removal film 38 and the impurity permeation prevention film 27 is wet-etched in an H$_2$SO$_4$; H$_2$O$_2$; C$_2$H$_4$ (OH)$_2$ = 1:2:7 solution using the patterned second photo-resist 30 as an etching mask, as shown in FIG. 5h.

Figure 5I:
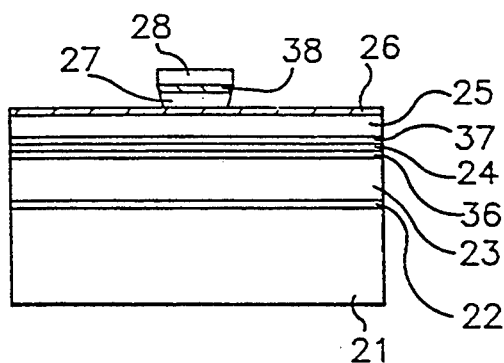

Thereafter, the pattered second photo-resist 30 is removed, as shown in FIG. 5i.

Figure 5J:
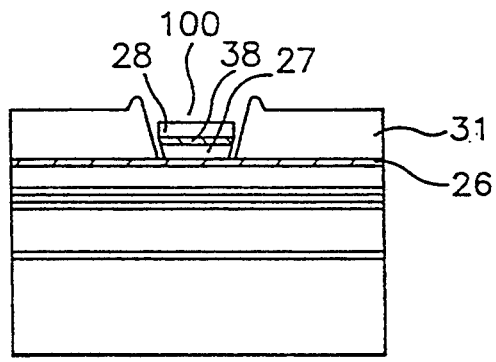

Subsequently, a current confinement layer 31 is grown on the exposed quantum well layer 26 with an MOCVD method, thereby forming a current injection groove 100, as shown in FIG. 5j.

Figure 5K:
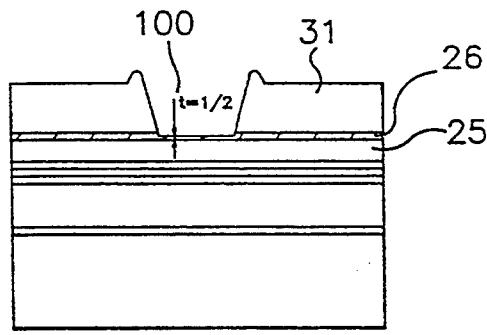

The wafer shown in FIG. 5j is dipped into a buffered oxide etchant to remove the insulation film 28, as shown in FIG. 5k.

The wafer is again dipped into the H$_2$SO$_4$; H$_2$O$_2$; C$_2$H$_4$(OH)$_2$ solution to remove the selective removal film 38 and the impurity permeation prevention film 27.

Thereafter, as shown in FIG. 5k, the exposed quantum well layer 26 corresponding to the current injection groove region is wet-etched with an NH$_4$OH; H$_2$O$_2$; H$_2$O = 1:1:500 solution until its thickness $t_2$ becomes less than one-half of the original thickness $t_1$, thereby completely removing the defects at the boundary between the impurity permeation prevention film 27 and the quantum well layer 26.

Figure 5L:
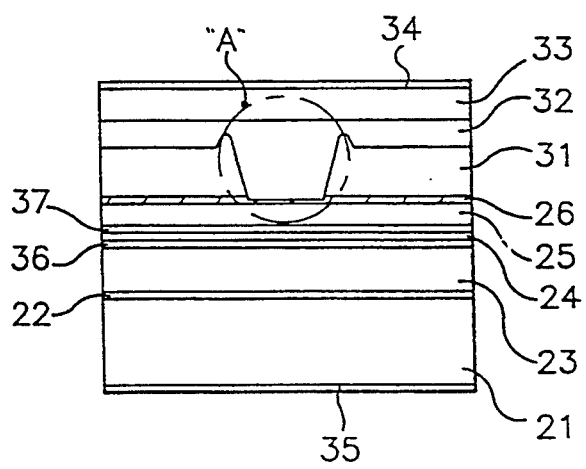

As shown in FIG. 5l, a third clad layer 32 made of a p-type Al$_{0.6}$GaAs and a cap layer 33 made of a p-type GaAs are formed on the surfaces of the current confinement layer 31 and the quantum well layer 26 corresponding to the current injection groove 100 using a MOCVD method. Then, a p-type electrode and an n-type electrode are formed on the upper surface of the cap layer 33 and the lower surface of the substrate 21, respectively, to complete the semiconductor laser diode according to the second embodiment.

The shape of current injection groove 100 may be varied in accordance with the stripe direction of current injection groove 100, similar to the first embodiment. Also, upon the formation of the patterned second photo-resist, the stripe direction of the current injection groove is decided in accordance with the crystal direction of quantum well layer 26 which is disposed just below the second photoresist. In particular, if the crystal direction is $<011>$ or $<0\bar{1}\bar{1}>$, the current injection groove 100 is formed with a V shape. On the other hand, the current injection groove 100 is formed having a reverse mesa shape if the crystal direction is $<0\bar{1}1>$ or $<01\bar{1}>$. Similar to the first embodiment, the defects in a region A of FIG. 5l is completely removed since the quantum well layer 26 made of GaAs is melted into the third clad layer 32 made of Al$_{0.6}$Ga$_{0.4}$As.

Figure 6:
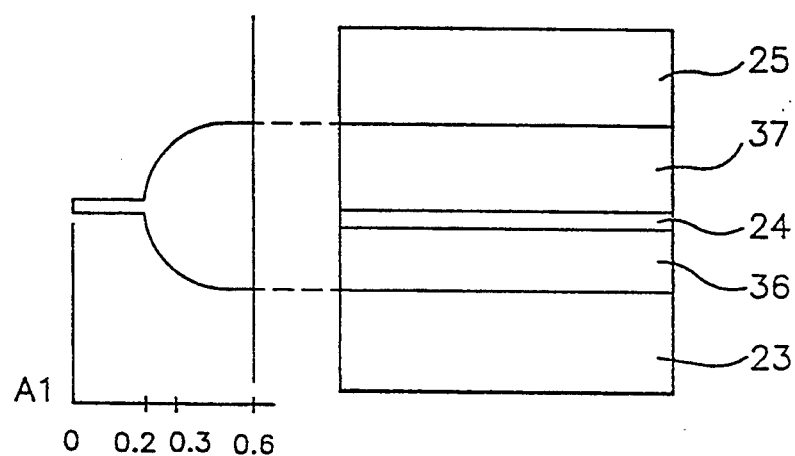
FIG. 6 is a diagram showing a graded layer in accordance with the second embodiment of the present invention.

In FIG. 6, a GRIN-SCH laser diode is illustrated according to the second embodiment where the first graded layer 36 made of an n-type Al$_y$GA$_{1-y}$As(y=0-.6–0.2) and the second graded layer 37 made of a p-type Al$_x$ Ga$_{1-x}$As(x=0.2–0.6) are formed on the lower surface and the upper surface of the active layer 24 made of an undoped GaAs, respectively, thereby obtaining a wavelength of 830.

Figure 7:
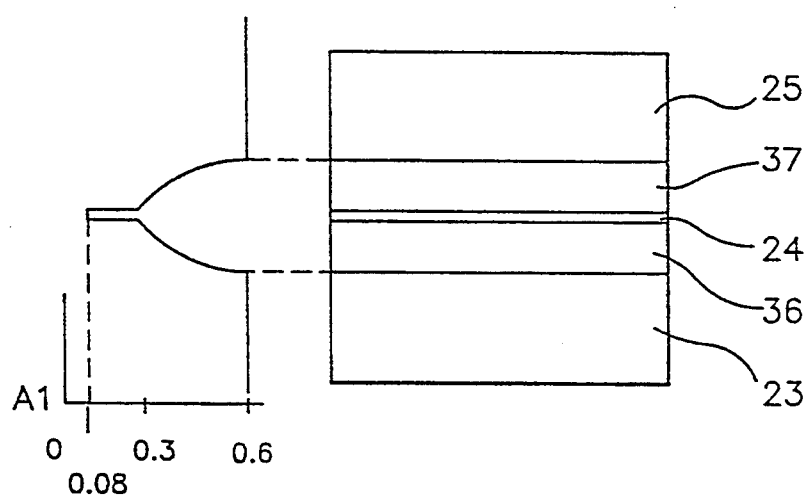
FIG. 7 is a diagram showing a graded layer in accordance with a third embodiment of the present invention.

In FIG. 7, another GRIN-SCH laser diode is illustrated according to the second embodiment where the first graded layer 36 made of an n-type $Al_yGa_{1-y}As$- (y=0.6–0.3) and the second graded layer 37 made of a p-type $Al_xGa_{1-x}As$(x=0.3–0.6) are formed on the lower surface and the upper surface of the active layer 24 made of $Al_{0.08}Ga_{0.92}As$, respectively, thereby obtaining a wavelength of 780.

Accordingly, the semiconductor laser diode of the present invention and the method for manufacturing the same, as apparent from the above description, have an advantage in that the current injection groove, having a constant shape in a wafer having a large area, can be stably formed since the current injection groove is formed using a selective growth process instead of an etching process.

Also, the reliability of the semiconductor laser diode of the present invention is improved since the defects of the exposed layer due to an etching process is naturally removed during the execution of another process.

Figure 8:
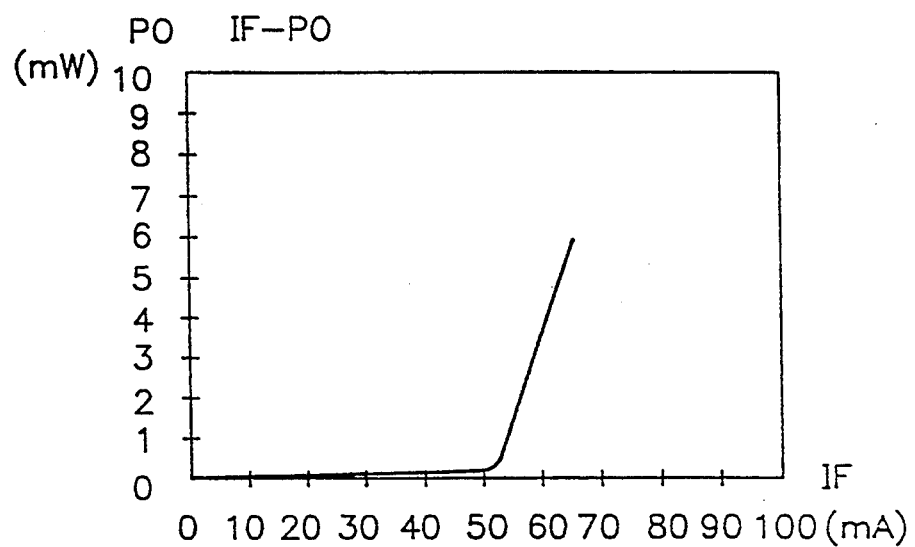
FIG. 8 is a typical I-L curve diagram of a semiconductor laser diode in accordance with the first embodiment of the present invention.
Figure 9:
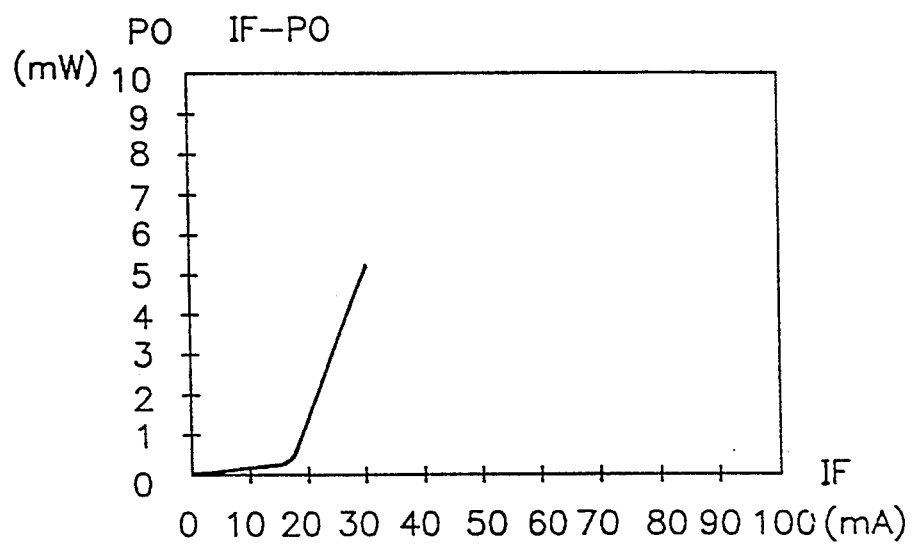
FIG. 9 is a typical I-L curve diagram of a semiconductor laser diode in accordance with the second embodiment of the present invention.

Also, there is another advantage in that the semiconductor laser diodes according to the first embodiment and the second embodiment have very low threshold currents (about 50 mA and 5–20 mA), respectively, as shown in FIG. 8 and FIG. 9 which are respective I-L curve diagrams.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A method for manufacturing a semiconductor laser diode, comprising the steps of:
   a) growing a double hereto structure on a substrate, said double hetero structure including a first clad layer, an active, and a second clad layer;
   b) growing a quantum well layer on said double hereto structure;
   c) selectively growing a current confinement layer to form a current injection groove on said quantum well layer;
   d) growing a third clad layer on said current confinement layer and an exposed surface of said quantum well layer by LPE, thereby melting back said quantum well layer into said third clad layer;
   e) growing a cap layer on said third clad layer; and
   f) forming electrodes both side on said cap layer and said substrate.

2. A method for manufacturing a semiconductor laser diode in accordance with claim 1, wherein said quantum well layer includes an undoped-GaAs layer having a thickness within a range of 30 to 100 Å.

3. A method for manufacturing a semiconductor laser diode in accordance with claim 1, wherein said step of selectively growing a current confinement layer comprises the steps of:
   a) growing an interface protection layer on said quantum well layer;
   b) depositing an insulating layer on said interface protection layer;
   c) patterning said insulating layer to form a striped insulation layer by a first photoetching process;
   d) patterning said interface protection layer to form a same pattern as said striped insulating layer by a second photoetching process;
   e) selectively growing said current confinement layer on said quantum well layer using said striped insulation layer and interface protection layer as a mask; and
   f) removing said striped insulation layer and said interface protection layer.

4. A method for manufacturing a semiconductor laser diode in accordance with claim 3, wherein said interface protection layer is made of $Al_xGa_{1-x}As$ (x>0.6) and has a thickness over 1000 Å.

5. A method for manufacturing a semiconductor laser diode in accordance with claim 3, wherein the insulation film is made of one of $Si_3N_4$ and $SiO_2$.

6. A method for manufacturing a semiconductor laser diode in accordance with claim 3, wherein a width of the striped insulation layer is 3~7 μm.

7. A method for manufacturing a semiconductor laser diode in accordance with claim 3, wherein the current confinement layer is grown using an MOCVD method.

8. A method for manufacturing a semiconductor laser diode in accordance with claim 1, wherein said step of selectively growing said current confinement layer comprises the steps of:
   a) oxidizing said quantum well layer to form an oxidation quantum well layer;
   b) patterning said oxidation quantum well layer to form a striped oxidation quantum well layer;
   c) selectively growing said current confinement layer using said striped oxidation quantum well layer as a mask on said double hereto structure; and
   d) removing the striped oxidation quantum well layer.

9. A method for manufacturing a semiconductor laser diode in accordance with claim 8, wherein the striped insulation layer is formed along a crystal direction <011> or <0$\overline{1}$1> of said quantum well layer.

10. A method for manufacturing a semiconductor laser diode in accordance with claim 8, wherein the pattern of the photo-resist is formed along a crystal direction <011> or <011> of the quantum well layer.

11. A method for manufacturing a semiconductor laser diode in accordance with claim 8, wherein the patterned oxidation quantum well layer has a width approximately in the range of 3–7 μm.

12. A method for manufacturing a semiconductor laser diode in accordance with claim 1, wherein said step of selectively growing said current confinement layer comprises the steps of:
   depositing an insulation layer having a double structure on said quantum well layer;
   patterning said insulation layer to form a striped insulation layer by a photoetching process;
   selectively growing said current confinement layer on said quantum well layer using said striped insulation layer as a mask to form a current injection groove; and
   removing the striped insulation layer.

13. A method for manufacturing a semiconductor laser diode in accordance with claim 12, wherein the step of patterning the oxidation quantum well layer forms a pattern along a crystal direction <011> or <0$\overline{1}$1> of said second clad layer.

14. A method for manufacturing a semiconductor laser diode in accordance with claim 12, wherein the step of patterning the oxidation quantum well layer forms a pattern along a crystal direction $<01\bar{1}>$ or $<011>$ of said second clad layer.

15. A method for manufacturing a semiconductor laser diode in accordance with claim 12, wherein the insulation film having the double structure is made of one of $PSG/SiO_2$ and $PSG/Si_3N_4$.

16. A method for manufacturing a semiconductor laser diode in accordance with claim 12, wherein the step of patterning the insulation film having the double structure forms a pattern along a crystal direction $<011>$ or $<0\bar{1}\bar{1}>$ of the quantum well layer.

17. A method for manufacturing a semiconductor laser diode in accordance with claim 12, wherein the step of patterning the insulation film having the double structure forms a pattern along a crystal direction $<0\bar{1}1>$ or $<01\bar{1}>$ of the quantum well layer.

18. A method for manufacturing a semiconductor laser diode in accordance with claim 12, wherein the patterned insulation film having the double structure has a width approximately in the range of 3–7 μm.

19. A method for manufacturing a semiconductor laser diode in accordance with claim 1, further comprising a step of growing a buffer layer on said substrate.

20. A method for manufacturing a semiconductor laser diode in accordance with claim 1, wherein said third clad layer is the same as said second clad layer.

* * * * *

UNITED STATES PATENT AND TRADEMARK OFFICE
CERTIFICATE OF CORRECTION

PATENT NO. : 5,445,993
DATED : August 29, 1995
INVENTOR(S) : Hyung Soo AHN et al It is certified that error appears in the above-indentified patent and that said Letters Patent is hereby corrected as shown below:

Claim 1, Column 9, Line 40 "hereto" should read --hetero--;

Column 9, Line 44 "hereto" should read --hetero--.

Claim 8, Column 10, Line 33, "hereto" should read --hetero--.

Signed and Sealed this

Thirteenth Day of August, 1996

*Attest:*

BRUCE LEHMAN

*Attesting Officer*     *Commissioner of Patents and Trademarks*